United States Patent
Hidaka et al.

(10) Patent No.: US 7,106,121 B2
(45) Date of Patent: Sep. 12, 2006

(54) HIGH FREQUENCY SWITCH CIRCUIT

(75) Inventors: Kenichi Hidaka, Takatsuki (JP); Katsushi Tara, Kyoto (JP); Tadayoshi Nakatsuka, Hellerup (DK)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/819,976

(22) Filed: Apr. 8, 2004

(65) Prior Publication Data

US 2004/0207454 A1   Oct. 21, 2004

(30) Foreign Application Priority Data

Apr. 16, 2003 (JP) .............................. 2003-111464

(51) Int. Cl.
  *H03L 5/00* (2006.01)
(52) U.S. Cl. ..................... 327/308; 327/374; 333/81 R
(58) Field of Classification Search ................. 327/308; 333/81 R
See application file for complete search history.

(56) References Cited

U.S. PATENT DOCUMENTS

| | | | | |
|---|---|---|---|---|
| 4,367,421 A | * | 1/1983 | Baker | 327/432 |
| 4,719,374 A | | 1/1988 | Bialo | 327/43 |
| 4,929,855 A | * | 5/1990 | Ezzeddine | 327/427 |
| 5,350,957 A | * | 9/1994 | Cooper et al. | 327/427 |
| 5,731,607 A | * | 3/1998 | Kohama | 257/275 |
| 5,883,541 A | * | 3/1999 | Tahara et al. | 327/434 |
| 5,969,560 A | | 10/1999 | Kohama et al. | 327/308 |
| 6,218,890 B1 | | 4/2001 | Yamaguchi et al. | 327/427 |
| 6,803,680 B1 | * | 10/2004 | Brindle et al. | 307/115 |
| 6,804,502 B1 | * | 10/2004 | Burgener et al. | 455/333 |
| 6,853,235 B1 | * | 2/2005 | Nakayama et al. | 327/379 |

FOREIGN PATENT DOCUMENTS

| | | |
|---|---|---|
| EP | 0723337 A2 | 7/1996 |
| EP | 0723337 A3 | 4/1997 |
| EP | 0913939 A2 | 5/1999 |
| EP | 0913939 A3 | 12/2000 |
| JP | 58184821 | 10/1983 |
| JP | 04207219 | 7/1992 |
| JP | 7106937 | 4/1995 |
| JP | 08204528 | 8/1996 |
| JP | 8213893 | 8/1996 |
| JP | 8213893 A | 8/1996 |
| JP | 08293776 | 11/1996 |
| JP | 2000277703 | 10/2000 |

OTHER PUBLICATIONS

Japanese Office Action dated Dec. 14, 2005 with English translation.

* cited by examiner

*Primary Examiner*—Tuan T. Lam
*Assistant Examiner*—Hiep Nguyen
(74) *Attorney, Agent, or Firm*—Stevens, Davis, Miller & Mosher, LLP (57) ABSTRACT

One end of each of five resistors is connected to each of the two ends and the respective intermediate points of a cascade of four depression-type FETs, while the other ends of the five resistors are provided with a predetermined voltage. This configuration fixes the source-drain potential of the four FETs. This fixing of the source-drain potential of the FETs permits stable application of a bias voltage for turning ON the FETs between the gate and the source each FET, so as to ensure the ON-OFF switching of the FETs.

5 Claims, 9 Drawing Sheets

HIGH FREQUENCY SWITCH CIRCUIT

BACKGROUND OF THE INVENTION

1. Technical Field

The present invention relates to a high frequency switch circuit built in a switch semiconductor integrated circuit or a communication terminal device. In particular, the invention is preferably applicable in a high frequency switch circuit which needs to have low insertion loss, high isolation, and low distortion characteristics, as well as in a communication terminal device using this switch circuit. This high frequency switch circuit is used, for example, as an antenna switch in a portable phone.

2. Prior Art

In these days, mobile telecommunication business such as in car telephones and portable phones is growing in remarkable rapidness. In many countries in the world, various mobile telecommunication systems have commenced operations. Meanwhile, in these mobile telecommunication systems, semiconductor field effect transistors (FETs) are used widely in signal processing units in major portable terminals. In particular, in order to improve the portability in portable terminals, considerable efforts are devoted into the development of monolithic microwave ICs (MMICs) using GaAs-FETs which are expected to serve as semiconductor integrated circuit devices permitting all of size reduction, low voltage driving, and power consumption reduction. Among these MMICs, high frequency switches for switching a high frequency signal in a portable terminal are important as a target of development.

When an FET is used as a switching device, a bias voltage applied to the gate terminal of the FET needs to be controlled. For example, when a gate bias sufficiently higher than the pinch-off voltage is applied to the gate terminal, the drain-source impedance is reduced, so that the FET is controlled to go ON. On the contrary, when a gate bias sufficiently lower than the pinch-off voltage is applied to the gate terminal, the drain-source impedance is increased, so that the FET is controlled to go OFF.

When such a single FET is used as a switching device, a GaAs-FET has a low insertion loss, but has a difficulty in increasing the isolation. The isolation in a single FET is increased by reducing the gate width of the FET. Nevertheless, the reduction of the gate width causes an increase in the ON resistance, and hence causes the problem of an increase in the insertion loss. Thus, a low insertion loss and a high isolation are difficult to be achieved simultaneously.

As such, a low insertion loss and a high isolation are difficult to be achieved simultaneously in a single FET. However, this problem is addressed by using a combination of FETs.

An example of a high frequency switch circuit having such configuration is an SPDT (single pole dual throw) switch composed of a series FET and a shunt FET connected respectively in series and in shunt relative to the signal path (for example, see JP-A-H08-213893 (pp. 2–3 and FIG. 2)). The series FET is an FET connected in an inserted configuration into the signal line. The shunt FET is an FET connected between the signal line and the ground.

According to this configuration, an RF signal having been leaked through a parasitic capacitance component in the series FET in an OFF state is drawn into the ground via the shunt FET in an ON state. This realizes a high isolation.

Further, this single stage FET circuit composed of one series FET and one shunt FET for reducing the signal leakage through the series FET in the OFF state may be duplicated into a cascade of multistage. This configuration further reduces the signal leakage through this single stage FET circuit.

Nevertheless, in the configuration of such a multistage cascade of the FET circuits, the voltage is undetermined in the intermediate connection points between a plurality of these series FETs. This causes instability in the operation of the series FETs, and hence prevents reliable ON-OFF switching based on the gate voltage control.

Figure 9:
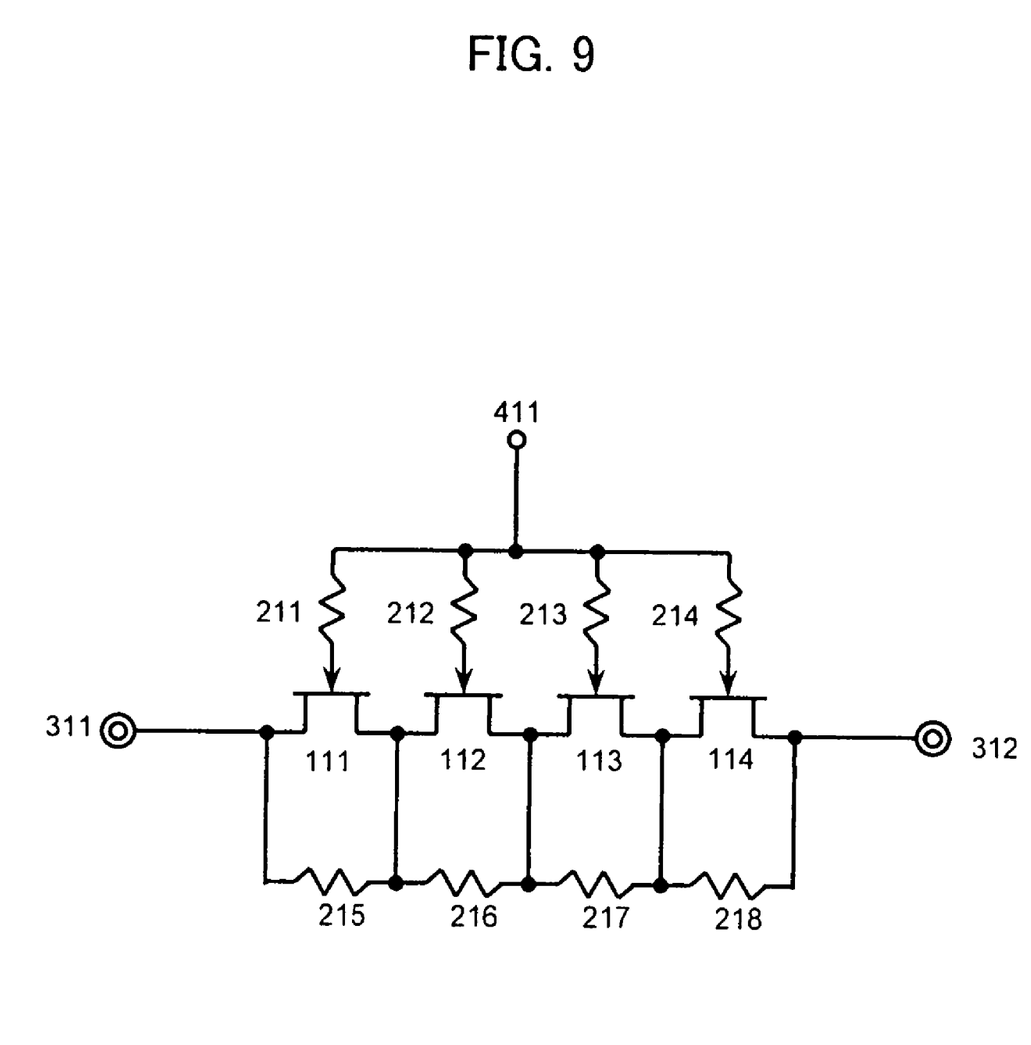
FIG. 9 is a circuit diagram showing the configuration of a high frequency switch circuit according to the prior art.

In order to resolve this problem, a modification is proposed that in the multistage cascade of the FET circuits, the source and the drain of each FET are interconnected through a resistor (for example, see JP-A-2000-277703 (pp. 4–5 and FIG. 1)). This configuration is shown in FIG. 9. In FIG. 9, numerals 111–114 indicate FETs interconnected in series. Numerals 211–214 indicate resistors one end of each of which is connected to the gate of each FET 111–114. Numerals 215–218 indicate resistors each of which interconnects the source and the drain of each FET 111–114. Numerals 311 and 312 indicate high frequency signal input and output terminals. Numeral 411 indicates a control terminal connected in common to the other terminals of the resistors 211–214 so as to receive a control signal for controlling the ON-OFF of the FETs 111–114.

As such, in this configuration, the source and the drain of each FET 111–114 are interconnected through each resistor 215–218, so that the voltage is fixed at the intermediate connection points between a plurality of the series FETs 111–114. This stabilizes the operation of the FETs.

In this configuration of the prior art, in the multistage cascade of the FET circuits, the voltage is fixed at the intermediate connection points between the FETs. Nevertheless, this voltage has a value arbitrarily determined by the gate voltage of the FET as well as the gate-source resistance Rgs and the gate-drain resistance Rgd of the FET.

When the FETs are to be set OFF by an arbitrary voltage, the gate voltage is changed, and so is the voltage in the intermediate connection points. This can result in a situation that the signal inputted through the high frequency signal input and output terminal 311 or the other is not shut off reliably. In particular, when a large signal is inputted, the FETs cannot reliably be set OFF, so that the signal can leak.

Described below is the reason why the FETs cannot reliably be set OFF when a large signal is inputted. When a high frequency signal is inputted to the high frequency switch circuit composed of the FETs, the voltage amplitude depends on the input power. When a signal of a high power is inputted, the voltage amplitude becomes accordingly large. This results in a situation that at the timing near the peak of the high frequency voltage waveform, the gate-source voltage of the FETs cannot be maintained in a reverse bias state. This causes temporary conduction in the FETs near the peak of the high frequency voltage waveform. This mechanism is described in detail in JP-A-H07-106937.

For example, when FETs are used in an antenna switch, the highest priority is assigned to the reduction of the insertion loss. The reduction of the insertion loss requires the reduction of the ON resistance of the FETs. When the FETs are used in a forward bias state, the ON resistance of the FETs can be reduced. Nevertheless, in the above-mentioned configuration of the prior art, the voltage of the intermediate connection points is arbitrarily determined as described above. This has prevented the high frequency switch circuit from being used in a state of the lowest ON resistance.

SUMMARY OF THE INVENTION

An object of the invention is to provide a high frequency switch circuit the FETs of which are maintained in an OFF state even when a large signal is inputted.

Another object of the invention is to provide a high frequency switch circuit capable of reliably operating in a forward bias state during the ON state operation, and thereby reducing the insertion loss.

In order to resolve the above-mentioned problems, a first invention is a high frequency switch circuit comprising: a first high frequency signal input and output terminal and a second high frequency signal input and output terminal for inputting and outputting a high frequency signal therethrough; and a cascade circuit of a plurality of FETs arranged between the first high frequency signal input and output terminal and the second high frequency signal input and output terminal; wherein a high level voltage or a low level voltage is selectively applied to the gate terminals of a plurality of the FETs, so that a plurality of the FETs are switched between an ON state and an OFF state, and wherein a predetermined voltage is applied to the two end points and the respective intermediate connection points of the cascade circuit of a plurality of the FETs via each resistor separately, so that the electric potential is fixed at the two end points and the respective intermediate connection points of the cascade circuit of a plurality of the FETs.

According to this configuration, a predetermined voltage is applied to the two end points and the respective intermediate connection points of the cascade circuit of a plurality of the FETs via each resistor separately, so that fixed is the electric potential at the two end points and the respective intermediate connection points of the cascade circuit of a plurality of the FETs, that is, fixed is the source-drain voltage of a plurality of the FETs. This avoids a fluctuation in the source-drain voltage which could occur otherwise depending on the level of the input signal. Thus, the source-drain voltage can be set corresponding to the expected maximum value of the input signal. When the source-drain voltage is set as such, the OFF state of each FET is maintained intact even when a large signal is inputted. Further, according to this configuration, when each FET is ON, each FET can reliably operate in a forward bias state, so that the insertion loss is reduced.

If the source-drain voltage were not fixed, the electric potential could not have a fixed value at the intermediate point between two cascaded FETs in an OFF state. Thus, when the electric potential of the intermediate point between the two FETs varies in the direction approaching the gate voltage of the FET, the source-drain voltage of the FET cannot be maintained in a reverse bias state when a large signal is inputted. That is, the OFF state of each FET cannot be maintained intact when a large signal is inputted.

A second invention is a high frequency switch circuit wherein: the drain terminal of a first FET is connected to the source terminal of a second FET; the drain terminal of the second FET is connected to the source terminal of a third FET; the drain terminal of the third FET is connected to the source terminal of a fourth FET; the source terminal of the first FET is connected to a first high frequency signal input and output terminal; the drain terminal of the fourth FET is connected to a second high frequency signal input and output terminal; one end of a first resistor is connected to the gate terminal of the first FET; one end of a second resistor is connected to the gate terminal of the second FET; one end of a third resistor is connected to the gate terminal of the third FET; one end of a fourth resistor is connected to the gate terminal of the fourth FET; the other ends of the first through fourth resistors are connected in common to a first control terminal; one end of a fifth resistor is connected to the first high frequency signal input and output terminal; one end of a sixth resistor is connected to a connection point between the first FET and the second FET; one end of a seventh resistor is connected to a connection point between the second FET and the third FET; one end of an eighth resistor is connected to a connection point between the third FET and the fourth FET; one end of a ninth resistor is connected to the second high frequency signal input and output terminal; the other ends of the fifth through ninth resistors are connected in common to a second control terminal; a high level voltage or a low level voltage is selectively applied to the first control terminal; and a predetermined voltage is applied to the second control terminal.

According to this configuration: one end of a fifth resistor is connected to the first high frequency signal input and output terminal; one end of a sixth resistor is connected to a connection point between the first FET and the second FET; one end of a seventh resistor is connected to a connection point between the second FET and the third FET; one end of an eighth resistor is connected to a connection point between the third FET and the fourth FET; one end of a ninth resistor is connected to the second high frequency signal input and output terminal; the other ends of the fifth through ninth resistors are connected in common to a second control terminal; and a predetermined voltage is applied to the second control terminal. This configuration fixes the electric potential at the two end points and the respective intermediate connection points of the cascade circuit of the first through fourth FETs, that is, the source-drain voltage of the first through fourth FETs. This allows the OFF state of the first through fourth FETs to be maintained intact even when a large signal is inputted. Further, according to this configuration, when the first through fourth FETs are ON, the first through fourth FETs can reliably operate in a forward bias state, so that the insertion loss is reduced.

Preferably, in a high frequency switch circuit according to the second invention: a third control terminal is connected to a voltage input terminal of a step-up circuit; a voltage output terminal of the step-up circuit is connected to the second control terminal; a voltage output terminal of the step-up circuit is connected to a supply voltage terminal of a logic circuit; a fourth control terminal is connected to a signal input terminal of the logic circuit; and a signal output terminal of the logic circuit is connected to the first control terminal.

According to this configuration, a control signal inputted from the outside into the third and fourth control terminals is stepped up by the step-up circuit, and then provided to the second and first control terminals. This configuration using the step-up circuit permits a higher handling power than that obtained in a cascade of the same number of FET stages but without a step-up circuit. In other words, the present configuration permits reliable switching of a signal having a higher input power. Further, when a certain handling power is required, the number of FET stages can be reduced. This advantageously reduces the chip size. The handling power mentioned here indicates the handling-allowable power, that is, the power which can be treated (switched) by the high frequency switch circuit when a voltage is provided to the high frequency switch circuit.

Preferably, in a high frequency switch circuit according to the second invention: a third control terminal is connected to a voltage input terminal of a step-up circuit; a voltage output terminal of the step-up circuit is connected to the anode of a diode; the cathode of the diode is connected to the second control terminal; a voltage output terminal of the step-up circuit is connected to a supply voltage terminal of a logic circuit; a fourth control terminal is connected to a signal input terminal of the logic circuit; and a signal output terminal of the logic circuit is connected to the first control terminal.

According to this configuration, when a control signal inputted from the outside into the third and fourth control terminals is stepped up by the step-up circuit and then provided to the second and first control terminals, the voltage of the second control terminal can be lower than that of the first control terminal by the value of the forward voltage drop across the diode. Thus, in the configuration using the step-up circuit, the FETs can operate in a bias state having a lower resistance value. This reduces the insertion loss in comparison with the prior art. The effect of the step-up circuit is the same as that described above.

Preferably, in a high frequency switch circuit according to the second invention: a third control terminal is connected to a voltage input terminal of a step-up circuit; a voltage output terminal of the step-up circuit is connected to one voltage input terminal of a voltage selection circuit; the third control terminal is connected to the other voltage input terminal of the voltage selection circuit; a voltage output terminal of the voltage selection circuit is connected to the second control terminal; a voltage output terminal of the step-up circuit is connected to a supply voltage terminal of a logic circuit; a fourth control terminal is connected to a signal input terminal of the logic circuit; a signal output terminal of the logic circuit is connected to the first control terminal; and the fourth control terminal is connected to a switching control terminal of the voltage selection circuit; whereby when a control signal for turning OFF the first through fourth FETs is provided to the fourth control terminal, the voltage selection circuit selects the voltage of the third control terminal, while when a control signal for turning ON the first through fourth FETs is provided to the fourth control terminal, the voltage selection circuit selects the output voltage of the step-up circuit.

According to this configuration, a voltage selection circuit is incorporated that selectively provides the voltage of the third control terminal or the output voltage of the step-up circuit to the second control terminal. This allows the voltage of the second control terminal to be a lower value when the first through fourth FETs are turned from OFF into ON. As a result, when the control signal provided to the fourth control terminal has changed from a state causing the first through fourth FETs to be OFF into a state causing the FETs to be ON, the first through fourth FETs go rapidly into a forward bias state. This reduces the delay in the timing of the change of the first through fourth FETs from OFF into ON.

Preferably, in a high frequency switch circuit according to the second invention: a third control terminal is connected to a voltage input terminal of a step-up circuit; a voltage output terminal of the step-up circuit is connected to one voltage input terminal of a voltage selection circuit; the third control terminal is connected to the other voltage input terminal of the voltage selection circuit; a voltage output terminal of the voltage selection circuit is connected to the anode of a diode; the cathode of the diode is connected to the second control terminal; a voltage output terminal of the step-up circuit is connected to a supply voltage terminal of a logic circuit; a fourth control terminal is connected to a signal input terminal of the logic circuit; a signal output terminal of the logic circuit is connected to the first control terminal; and the fourth control terminal is connected to a switching control terminal of the voltage selection circuit; whereby when a control signal for turning OFF the first through fourth FETs is provided to the fourth control terminal, the voltage selection circuit selects the voltage of the third control terminal, while when a control signal for turning ON the first through fourth FETs is provided to the fourth control terminal, the voltage selection circuit selects the output voltage of the step-up circuit.

Preferably, in a high frequency switch circuit described above, the resistance values of the fifth through ninth resistors are 1 k$\Omega$ or higher.

This configuration prevents the signal passing through the first through fourth FETs from leaking through the fifth through ninth resistors.

As described above, according to the high frequency switch circuit according to the invention, a cascade circuit of a plurality of FETs is used, while the electric potential is fixed at the two end points and the respective intermediate connection points of the cascade circuit of a plurality of the FETs. Thus, the OFF state of each FET is maintained intact even when a large signal is inputted. Further, according to this configuration, when each FET is ON, each FET can reliably operate in a forward bias state, so that the insertion loss is reduced. As such, good high frequency characteristics are obtained.

DETAILED DESCRIPTION OF THE PREFERRED EMBODIMENTS

Embodiment 1

Figure 1:
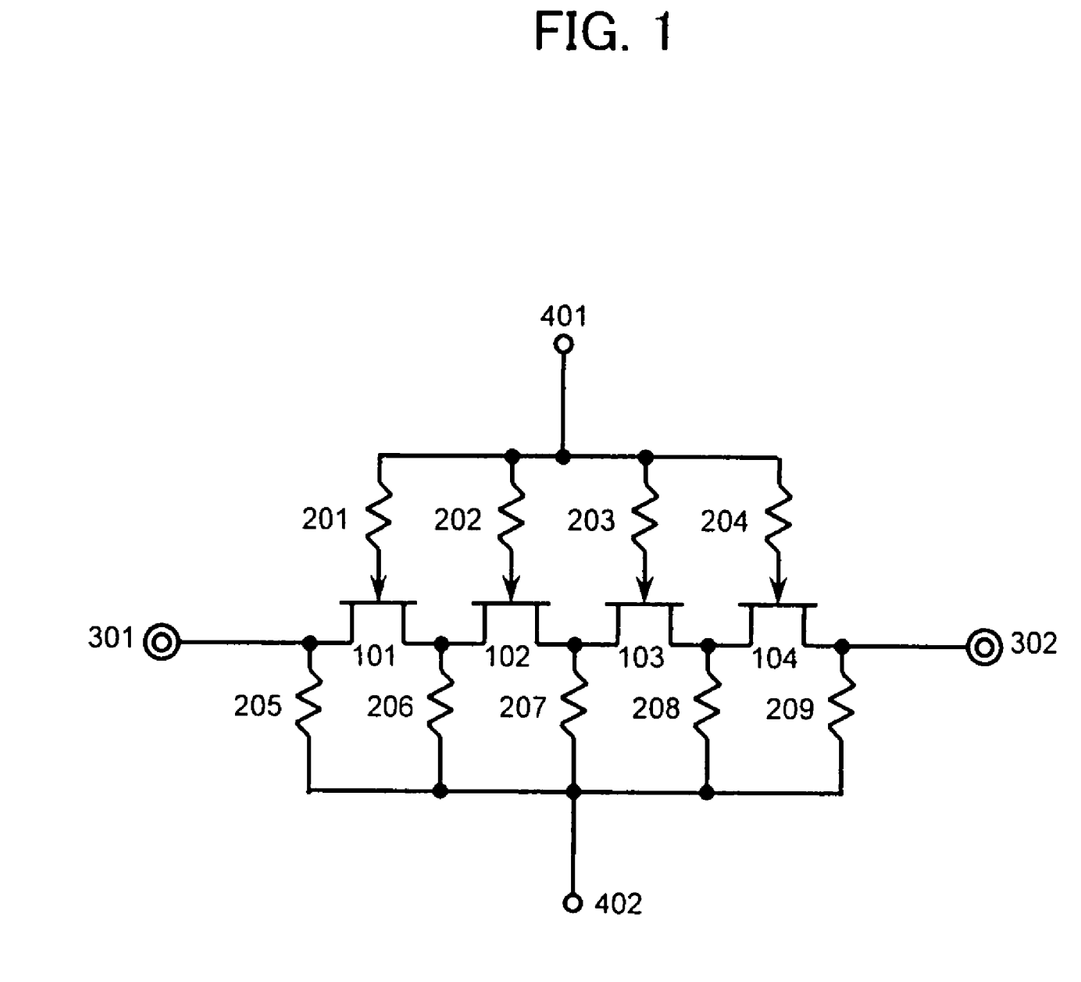
FIG. 1 is a circuit diagram showing the configuration of a high frequency switch circuit according to Embodiment 1 of the invention.

FIG. 1 is a circuit diagram of a high frequency switch circuit according to Embodiment 1 of the invention. In FIG.

1, numerals 101–104 indicate first through fourth FETs which are of depression type and cascaded. Numerals 201–204 indicate first through fourth resistors for providing a gate bias to the first through fourth FETs 101–104. Numerals 205–209 indicate fifth through ninth resistors for fixing the source-drain voltage of the first through fourth FETs 101–104. Numeral 301 indicates a first high frequency signal input and output terminal, while numeral 302 indicates a second high frequency signal input and output terminal. Numeral 401 indicates a first control terminal, while numeral 402 indicates a second control terminal.

The detailed connection relation is described below. The drain terminal of the FET 101 is connected to the source terminal of the FET 102. The drain terminal of the FET 102 is connected to the source terminal of the FET 103. The drain terminal of the FET 103 is connected to the source terminal of the FET 104.

The source terminal of the FET 101 is connected to the high frequency signal input and output terminal 301, while the drain terminal of the FET 104 is connected to the high frequency signal input and output terminal 302.

One end of the resistor 201 is connected to the gate terminal of the FET 101. One end of the resistor 202 is connected to the gate terminal of the FET 102. One end of the resistor 203 is connected to the gate terminal of the FET 103. One end of the resistor 204 is connected to the gate terminal of the FET 104. The other ends of the resistors 201–204 are connected in common to the control terminal 401.

One end of the resistor 205 is connected to the high frequency signal input and output terminal 301. One end of the resistor 206 is connected to the connection point between the FET 101 and the FET 102. One end of the resistor 207 is connected to the connection point between the FET 102 and the FET 103. One end of the resistor 208 is connected to the connection point between the FET 103 and the FET 104. One end of the resistor 209 is connected to the high frequency signal input and output terminal 302. The other ends of the resistors 205–209 are connected in common to the control terminal 402.

Described below is the operation of the high frequency switch circuit having the above-mentioned configuration.

When a signal inputted through the high frequency signal input and output terminal 301 is to be outputted through the high frequency signal input and output terminal 302, a high level voltage is applied to the control terminal 401.

Further, a high level voltage is applied to the control terminal 402. As a result, the high level voltage applied to the control terminal 402 is provided through the resistors 205–209 to the high frequency signal input and output terminals 301 and 302 as well as to the intermediate connection points of the cascade circuit of the FETs 101–104. By virtue of this, the electric potential is fixed at the high frequency signal input and output terminals 301 and 302 as well as at the intermediate connection points of the cascade circuit of the FETs 101–104.

The FETs 101–104 used herein are of depression type and has a threshold voltage of −1 V or the like. Thus, the FETs 101–104 go ON under the above-mentioned voltage condition.

At that time, when the voltage applied to the control terminal 402 is set appropriately, the voltage difference between the control terminal 401 and the control terminal 402 permits the FETs 101–104 to operate in a condition of sufficient forward bias voltage. This realizes a sufficiently low ON resistance value in the FETs 101–104. For example, when a 3 V voltage is applied to the control terminal 401, while a 2.5 V voltage is applied to the control terminal 402, a potential difference of 0.5 V is obtained between the gate and the source-drain of the FETs 101–104. This realizes a sufficient forward bias state in the FETs 101–104.

When a signal inputted through the high frequency signal input and output terminal 301 is not to be outputted through the high frequency signal input and output terminal 302, a low level voltage is applied to the control terminal 401.

Further, a high level voltage is applied to the control terminal 402. As a result, the high level voltage applied to the control terminal 402 is provided through the resistors 205–209 to the high frequency signal input and output terminals 301 and 302 as well as to the intermediate connection points of the cascade circuit of the FETs 101–104. By virtue of this, the electric potential is fixed at the high frequency signal input and output terminals 301 and 302 as well as at the intermediate connection points of the cascade circuit of the FETs 101–104.

The FETs 101–104 used herein are of depression type and has a threshold voltage of −1 V or the like. Thus, the FETs 101–104 go OFF under the above-mentioned voltage condition.

At that time, when the voltage applied to the control terminal 402 is set appropriately, the voltage difference between the control terminal 401 and the control terminal 402 realizes a sufficient reverse bias state in the FETs 101–104. This ensures the FETs 101–104 to be OFF, and hence permits a high isolation. For example, when a 0 V voltage is applied to the control terminal 401, while a 2.5 V voltage is applied to the control terminal 402, a potential difference of −2.5 V is obtained between the gate and the source-drain of the FETs 101–104. This realizes a sufficient reverse bias state.

According to this configuration, the electric potential is fixed at the two end points and the respective intermediate connection points of the cascade circuit of a plurality of the FETs 101–104. This allows that the OFF state of the FETs 101–104 is maintained intact even when a large signal is inputted. Further, when the FETs are ON, the FETs can reliably operate in a forward bias state, so that the insertion loss is reduced when the circuit is used as an antenna switch or the like. In short, the present circuit can operate in a bias state having a lower resistance value in comparison with the prior art where the source and the drain of each FET are interconnected simply by a resistor. This permits a lower insertion loss than that of the prior art.

Embodiment 2

In a circuit according to the invention, the resistors 205–209 for fixing the electric potential at the two end points and the respective intermediate connection points of the cascade circuit of the FETs 101–104 in Embodiment 1 have a resistance value of 1 kΩ or higher. The upper limit for the resistance value of the resistors 205–209 is not restricted specifically. However, in practice, the resistance value is preferably 1 MΩ or lower, or alternatively 10 MΩ or lower. The resistance value of the resistors 201–204 is set between a few tens kΩ and a few hundred kΩ or the like.

This configuration prevents the signal passing through the FETs 101–104 from leaking through the resistors 205–209. The other effects are the same as those of Embodiment 1.

Embodiment 3

Figure 2:
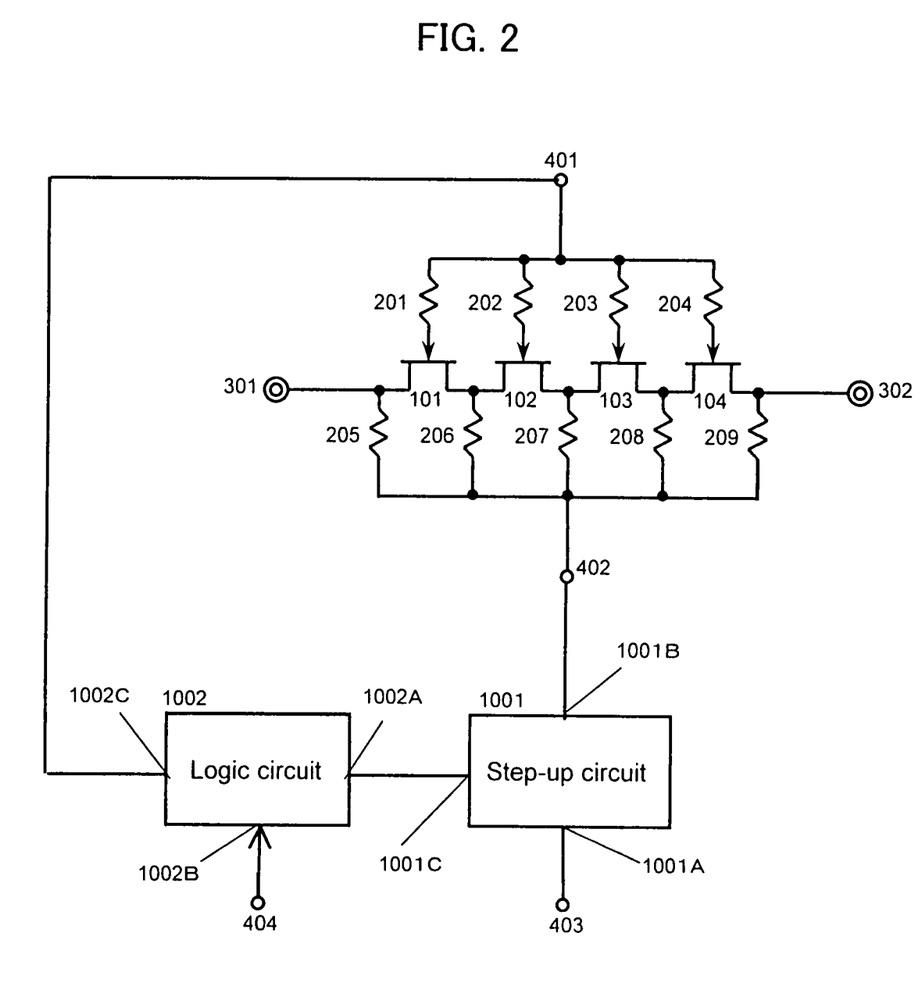
FIG. 2 is a circuit diagram showing the configuration of a high frequency switch circuit according to Embodiment 3 of the invention.

FIG. 2 is a circuit diagram of a high frequency switch circuit according to Embodiment 3 of the invention. In the previous Embodiment 1, a voltage applied from the outside has been provided intact to the control terminals 401 and 402. In contrast, in the present Embodiment 3, the voltage applied from the outside is stepped up first, and then this stepped-up voltage is provided to the control terminals 401 and 402.

For this purpose, in the present Embodiment 3, a step-up circuit 1001 and a logic circuit 1002 are added to the configuration of Embodiment 1. At the same time, added are: a control terminal 403 for providing a control voltage therethrough to the step-up circuit 1001; and a control terminal 404 for providing a control voltage therethrough to the logic circuit 1002. The step-up circuit 1001 steps up the voltage applied through the control terminal 403, into a desired voltage by means of a charge pump. The logic circuit 1002 uses the voltage stepped up by the step-up circuit 1001 as the supply voltage, and thereby converts the control signal inputted through the control terminal 404, into a control signal having the level of stepped-up voltage. This logic circuit 1002 may be composed of an ordinary NAND, NOR, or the like circuit.

More specifically, the control terminal 403 is connected to a voltage input terminal 1001A of the step-up circuit 1001. A voltage output terminal 1001B of the step-up circuit 1001 is connected to the control terminal 402. A voltage output terminal 1001C of the step-up circuit 1001 is connected to a supply voltage terminal 1002A of the logic circuit 1002. The control terminal 404 is connected to a signal input terminal 1002B of the logic circuit 1002. A signal output terminal 1002C of the logic circuit 1002 is connected to the control terminal 401. The other points of the configuration are the same as those of FIG. 1.

Described below is the operation of the high frequency switch circuit having the above-mentioned configuration. The voltage having been applied to the control terminal 402 in Embodiment 1 is instead applied to the control terminal 403. This voltage is stepped up by the step-up circuit 1001, and then the stepped-up voltage is applied to the control terminal 402.

Further, the voltage having been applied to the control terminal 401 in Embodiment 1 is instead applied through the control terminal 404 to the logic circuit 1002. By virtue of this, the control signal having the voltage level provided from the outside is converted into a control signal having the level of stepped-up voltage. This control signal having the level of stepped-up voltage is applied to the control terminal 401 in such a manner that the control signal serves as a high level signal in order to turn ON the switch, or that the control signal serves as a low level signal in order to turn OFF the switch. Thus, in contrast to Embodiment 1 where the control has been performed with the voltage level provided from the outside, the control in the present embodiment is performed with a higher voltage level. This configuration using the step-up circuit permits a higher handling power than that obtained in a cascade of the same number of FET stages but without a step-up circuit. Further, when a certain handling power is required, the number of FET stages can be reduced. This advantageously reduces the chip size.

Embodiment 4

Figure 3:
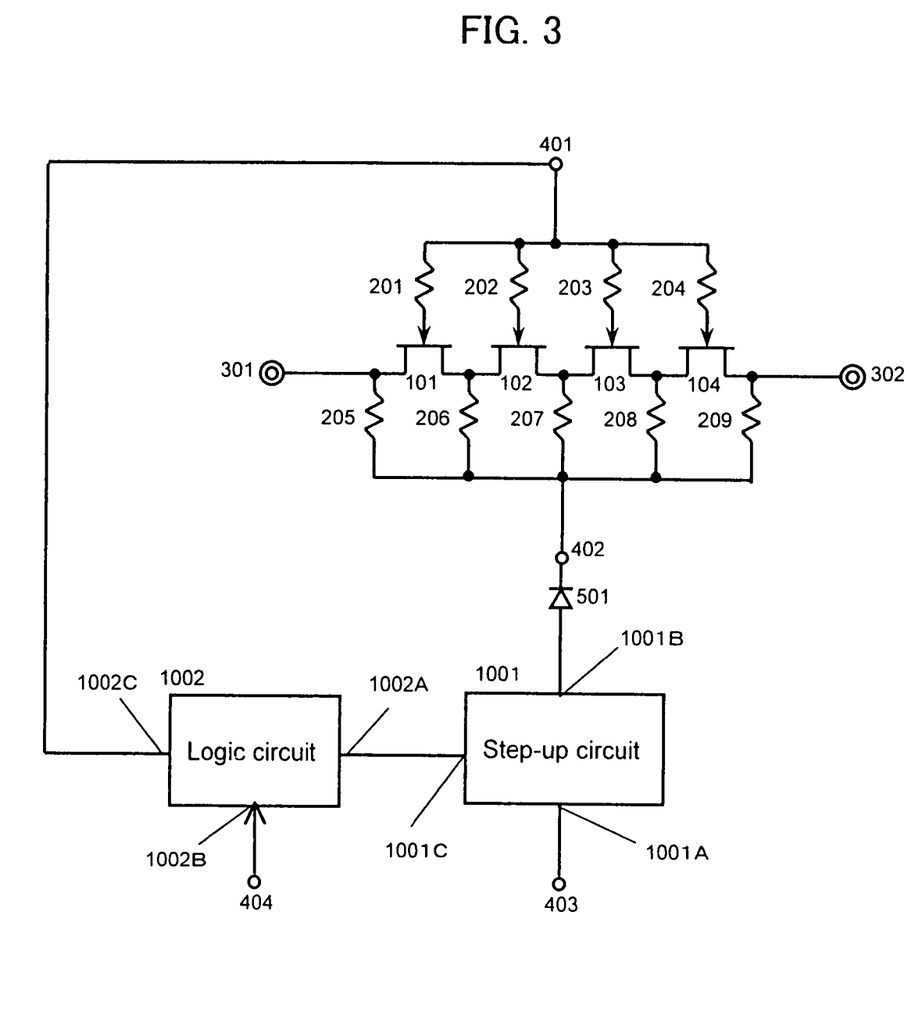
FIG. 3 is a circuit diagram showing the configuration of a high frequency switch circuit according to Embodiment 4 of the invention.

FIG. 3 is a circuit diagram of a high frequency switch circuit according to Embodiment 4 of the invention. In this embodiment, a diode 501 is inserted between the control terminal 402 and the step-up circuit 1001 in the above-mentioned configuration of Embodiment 3.

More specifically, the voltage output terminal 1001B of the step-up circuit 1001 is connected to the anode of the diode 501, while the cathode of the diode 501 is connected to the control terminal 402. The other points are the same as the configuration of FIG. 2.

Described below is the operation of the high frequency switch circuit having the above-mentioned configuration.

The voltage applied to the control terminal 403 is stepped up by the step-up circuit 1001. The stepped-up voltage is applied through the diode 501 and the resistors 205–209 to the source and the drain of the FETs 101–104. As a result, the voltage stepped up by the step-up circuit 1001 is lowered by the diode 501 by approximately 0.7 V. Then, this voltage is provided through the resistors 205–209 to the high frequency signal input and output terminals 301 and 302 and the intermediate connection points of the FETs 101–104. By virtue of this, the electric potential is fixed at these points.

This configuration reduces the voltage level applied to the high frequency signal input and output terminals 301 and 302 and the intermediate connection points of the FETs 101–104 by approximately 0.7 V in comparison with the voltage level of the high level control signal provided to the control terminal 401. This allows the FETs 101–104 having been in a zero bias state during ON operation in Embodiment 1 to be in a forward bias state of approximately 0.7 V. Thus, the present switch circuit can operate in a bias state having a lower resistance value even when the step-up circuit 1001 is used. This permits a lower insertion loss than that of the prior art.

The number of diode stages may be increased so as to increase the voltage difference.

Embodiment 5

Figure 4:
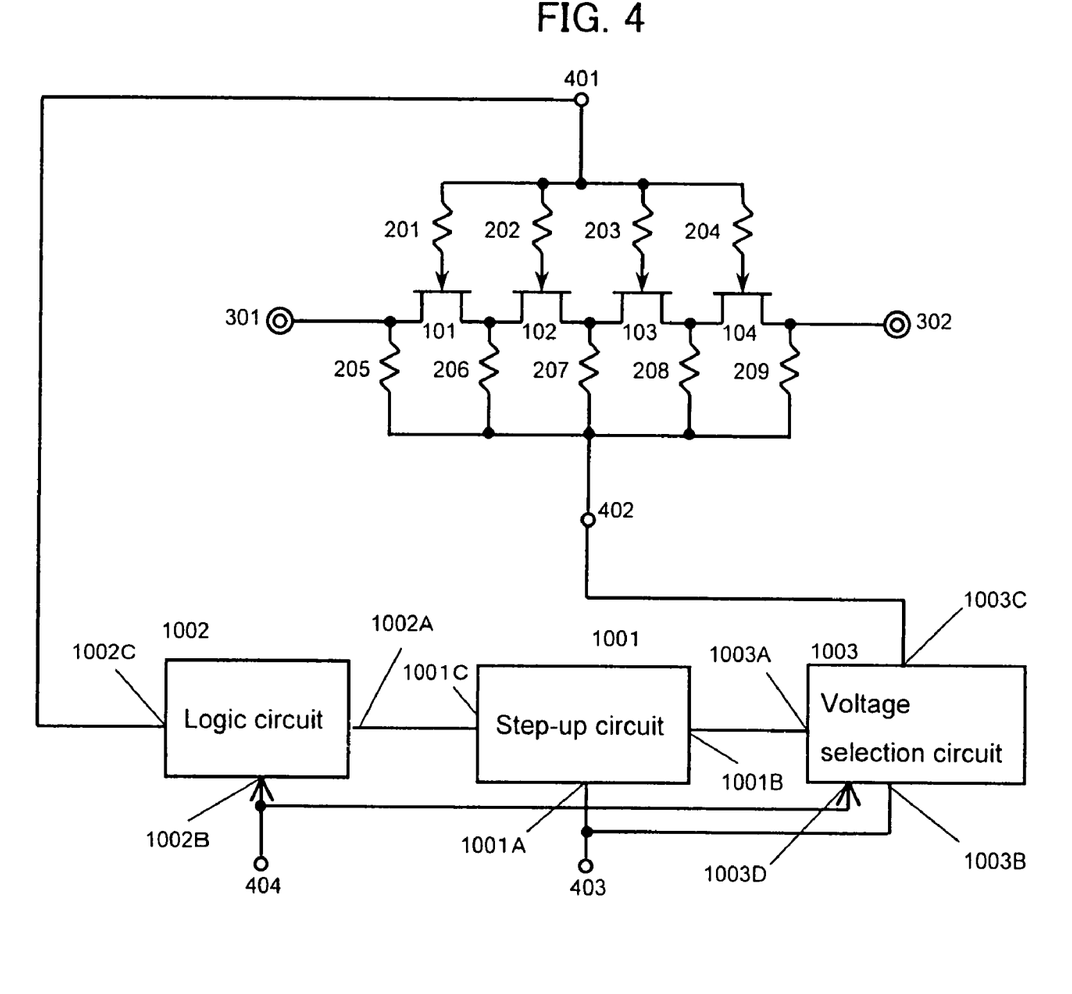
FIG. 4 is a circuit diagram showing the configuration of a high frequency switch circuit according to Embodiment 5 of the invention.

FIG. 4 is a circuit diagram of a high frequency switch circuit according to Embodiment 5 of the invention. In the previous Embodiment 3, the voltage stepped up by the step-up circuit 1003 has been applied directly to the control terminal 402. In contrast, in the present Embodiment 5, a voltage selection circuit 1003 is added, so that the voltage selection circuit 1003 selectively applies any one of the control voltage inputted through the control terminal 403 and the voltage stepped up by the step-up circuit 1001, to the control terminal 402.

More specifically, a voltage output terminal 1001B of the step-up circuit 1001 is connected to one voltage input terminal 1003A of the voltage selection circuit 1003. The control terminal 403 is connected to the other voltage input terminal 1003B of the voltage selection circuit 1003. A voltage output terminal 1003C of the voltage selection circuit 1003 is connected to the control terminal 402. The control terminal 404 is connected to a switching control terminal 1003D of the voltage selection circuit 1003. Then, when a control signal for turning OFF the FETs 101–104 is provided to the control terminal 404, the voltage selection circuit 1003 selects the voltage of the control terminal 403, while when a control signal for turning ON the FETs 101–104 is provided to the control terminal 404, the voltage selection circuit 1003 selects the output voltage of the step-up circuit 1001. The other points are the same as the configuration of FIG. 2.

The selection operation in the voltage selection circuit 1003 is controlled using the control signal inputted through the control terminal 404.

Figure 8:
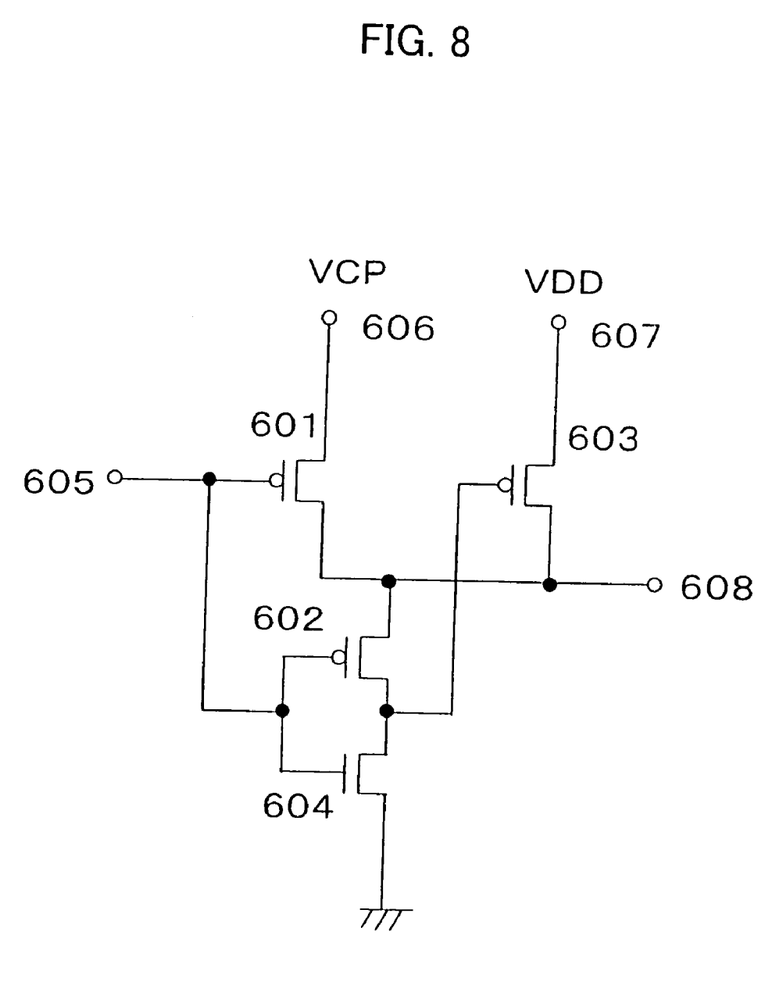
FIG. 8 is a circuit diagram showing the configuration of an example of voltage selection circuit.

FIG. 8 is a circuit diagram of an example of the voltage selection circuit 1003. In FIG. 8, numerals 601, 602, and 603 indicate p-channel MOS transistors, while numeral 604 indicates an n-channel MOS transistor. Numeral 605 indicates a selection signal input terminal. Numeral 606 indicates a stepped-up voltage input terminal for inputting the stepped-up voltage VCP therethrough. Numeral 607 indicates a control voltage input terminal for inputting the control voltage (supply voltage VDD) therethrough. Numeral 608 indicates a voltage output terminal.

In this configuration, when a low level voltage is applied to the selection signal input terminal 605, the p-channel MOS transistors 601, 602, and 603 go ON, ON, and OFF, respectively, while the n-channel MOS transistor 604 goes OFF, so that the stepped-up voltage VCP is outputted through the voltage output terminal 607. When a high level voltage is applied to the selection signal input terminal 605, the p-channel MOS transistors 601, 602, and 603 go OFF, OFF, and ON, respectively, while the n-channel MOS transistor 604 goes ON, so that the supply voltage VDD is outputted through the voltage output terminal 607.

Described below is the operation of the high frequency switch circuit having the above-mentioned configuration.

The high frequency switch circuit is used for switching an ON state and an OFF state. Accordingly, the switching delay time is important that is measured from the inputting of a control signal to the outputting of a waveform.

Figure 5A:
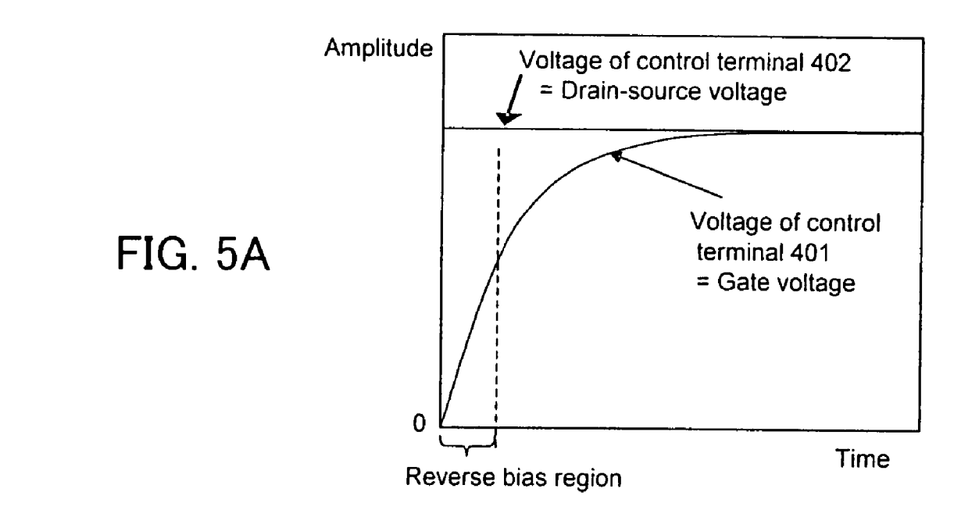
FIG. 5A is a waveform diagram showing the voltage waveforms at the control terminals of a high frequency switch circuit according to Embodiment 3 of the invention.
Figure 5B:
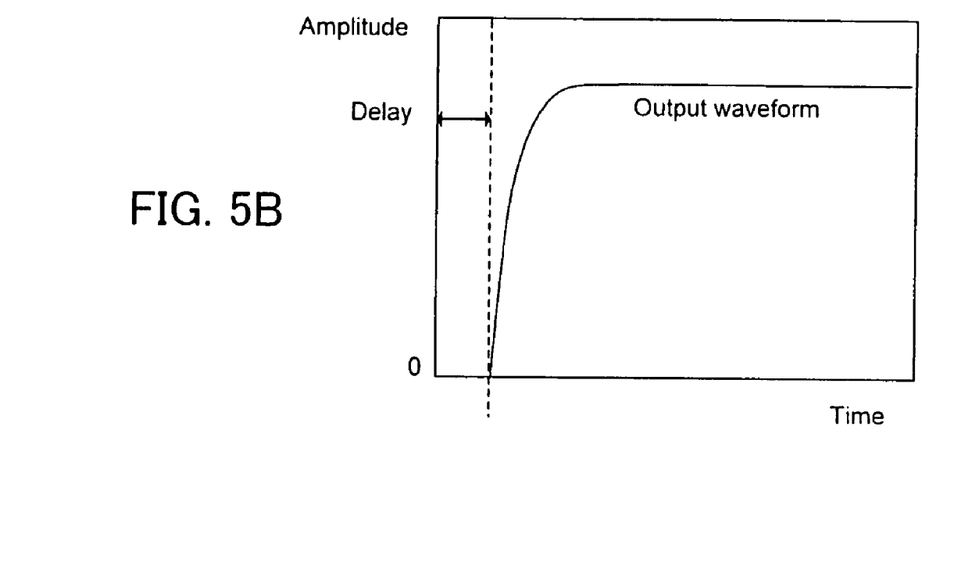
FIG. 5B is a waveform diagram showing the output signal waveform of a high frequency switch circuit according to Embodiment 3 of the invention.

In the previous Embodiment 3, the output voltage (stepped-up voltage) from the step-up circuit 1001 has always been applied to the control terminal 402. In this previous configuration, as shown in FIG. 5A, the source-drain voltage has been stepped up. Thus, the control signal inputted to the control terminal 404 has been stepped up by the logic circuit 1002, so that the voltage of the control terminal 401 has been increased. This has caused: an increase in the time necessary for reaching the voltage for turning ON the FETs 101–104. This has resulted in a delay measured from the inputting of the control signal to the control terminal 404 at time 0 to the actual outputting of the output waveform as shown in FIG. 5B.

In the previous Embodiment 4 where the electric potential at the high frequency signal input and output terminals 301 and 302 and the intermediate connection points of the FETs 101–104 has been fixed via the diode 501, the source-drain voltage is lower than that of Embodiment 3. Thus, the delay time is slightly reduced, but this reduction is not much meaningful.

Figure 6A:
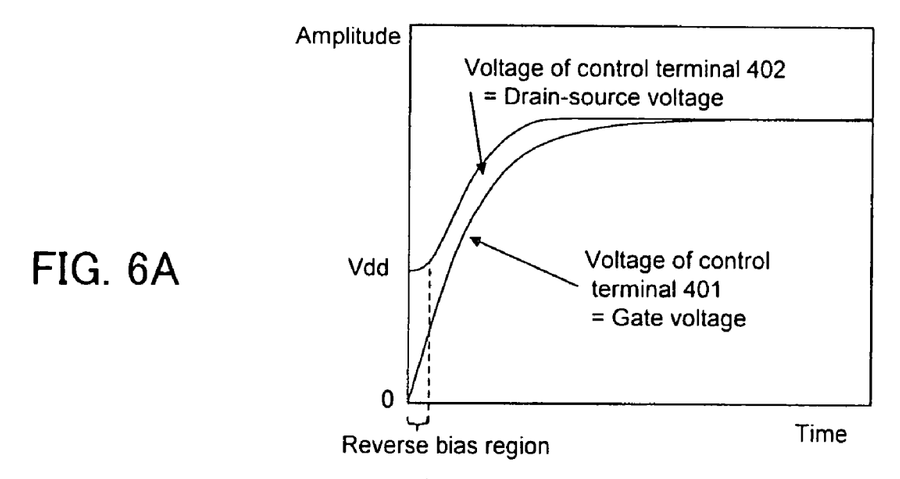
FIG. 6A is a waveform diagram showing the voltage waveforms at the control terminals of a high frequency switch circuit according to Embodiment 5 of the invention.

In the present configuration for resolving this problem, when the FETs 101–104 are OFF, the voltage selection circuit 1003 applies the voltage of the control terminal 403 directly to the control terminal 402, while when the FETs 101–104 are ON, the voltage selection circuit 1003 applies the voltage stepped up by the step-up circuit 1001, to the control terminal 402. As a result, as shown in FIG. 6A, the source-drain voltage increases from 3 V into the stepped-up voltage.

Figure 6B:
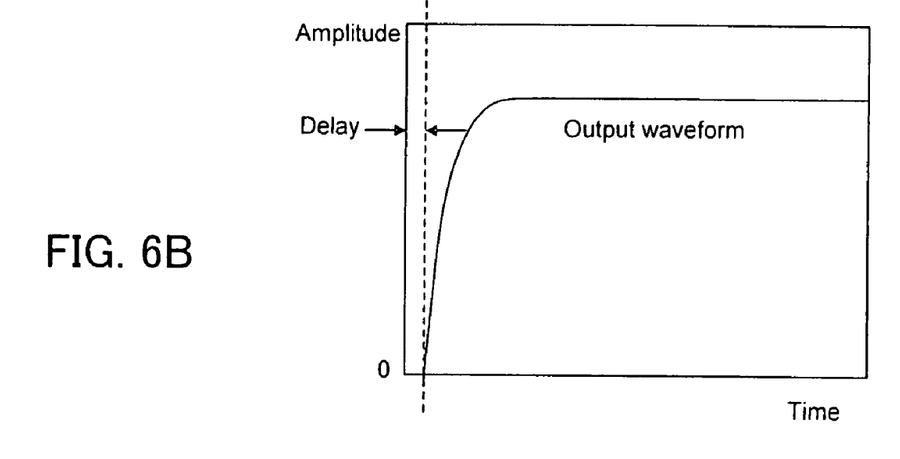
FIG. 6B is a waveform diagram showing the output signal waveform of a high frequency switch circuit according to Embodiment 5 of the invention.

According to this configuration, the FETs 101–104 go out from the reverse bias state more rapidly in comparison with the case that the source-drain voltage is the constant voltage of the step-up circuit 1001 as shown in FIG. 5A. This allows the FETs 101–104 to go ON more rapidly. This effect of allowing the FETs 101–104 to go ON more rapidly reduces the delay time measured from the inputting of the control signal to the control terminal 404 to the outputting of the waveform, as shown in FIG. 6B.

As described above, according to the configuration of the present embodiment, the voltage selection circuit 1003 is incorporated that selectively provides the voltage of the control terminal 403 or the output voltage of the step-up circuit 1001 to the control terminal 402. This allows the voltage of the control terminal 402 to be a lower value when the FETs 101–104 are turned from OFF into ON. As a result, when the control signal provided to the control terminal 404 has changed from a state causing the FETs 101–104 to be OFF into a state causing the FETs to be ON, the FETs 101–104 go rapidly into a forward bias state. This reduces the delay in the timing of the change of the FETs 101–104 from OFF into ON.

As a result, the rise time of output waveform is improved in the switching of the FETs used in a TDMA system for performing a bust operation. Thus, faster rise is achieved.

Embodiment 6

Figure 7:
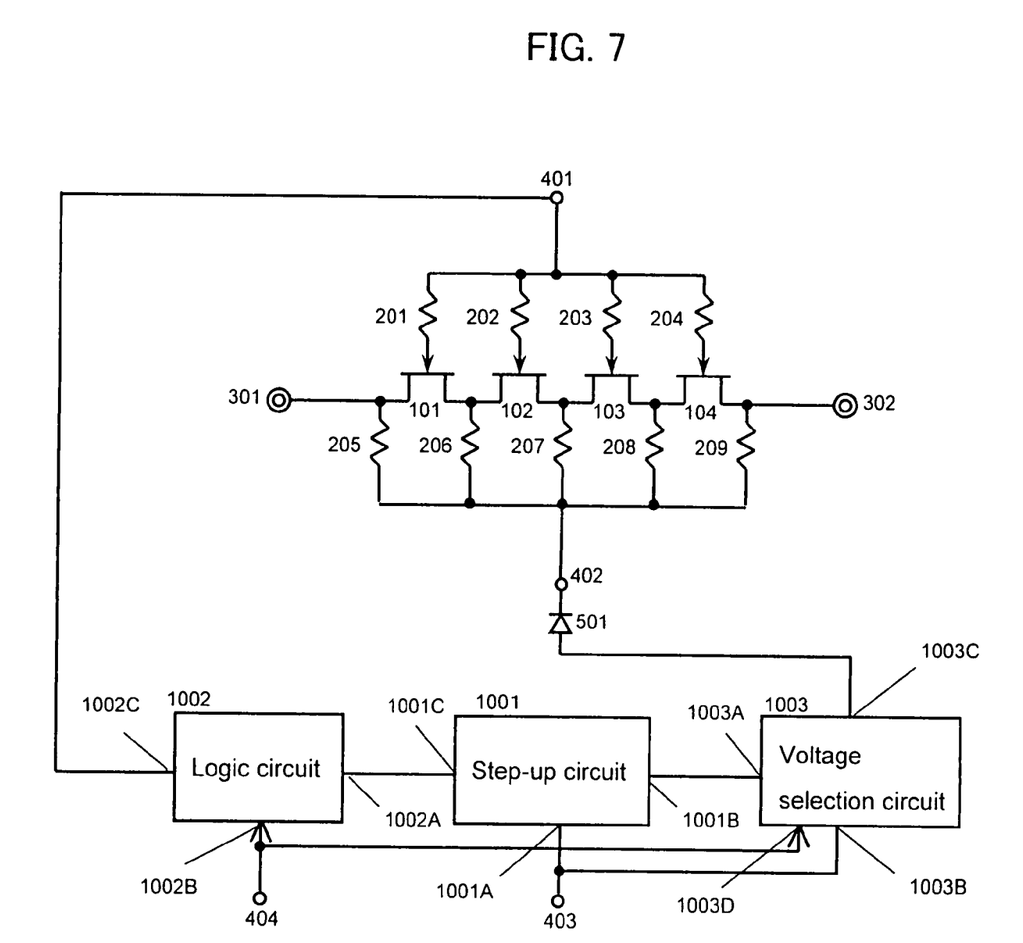
FIG. 7 is a circuit diagram showing the configuration of a high frequency switch circuit according to Embodiment 6 of the invention.

FIG. 7 is a circuit diagram of a high frequency switch circuit according to Embodiment 6 of the invention. In this embodiment, a diode 501 similar to that of Embodiment 4 is inserted between the voltage selection circuit 1003 and the control terminal 402 in the above-mentioned configuration of Embodiment 5.

This configuration using the diode 501 allows the FETs 101–104 to be in a forward bias state of approximately 0.7 V even when the voltage selection circuit 1003 is used. Thus, the present switch circuit can operate in a bias state having a lower resistance value even when the step-up circuit 1001 is used. This permits a lower insertion loss than that of the prior art. The other points are the same as those of Embodiment 5.

What is claimed is:

1. A high frequency switch circuit, comprising:
a first FET, a second FET, a third FET, a fourth FET, a first high frequency signal input and output terminal, a second high frequency signal input and output terminal, first through ninth resistors, a first control terminal, and a second control terminal, wherein said first FET has a drain terminal connected to a source terminal of the second FET, a drain terminal of said second FET is connected to a source terminal of said third FET, a drain terminal of said third FET is connected to a source terminal of said fourth FET, a source terminal of said first FET is connected to said first high frequency signal input and output terminal, a drain terminal of said fourth FET is connected to said second high frequency signal input and output terminal, one end of said first resistor is connected to a gate terminal of said first FET, one end of said second resistor is connected to a gate terminal of said second FET, one end of said third resistor is connected to a gate terminal of said third FET, one end of said fourth resistor is connected to a gate terminal of said fourth FET, the other ends of said first through fourth resistors are connected in common to said first control terminal, one end of said fifth resistor is connected to said first high frequency signal input and output terminal, one end of said sixth resistor is connected to a connection point between said first FET and said second FET, one end of said seventh resistor is connected to a connection point between said second FET and said third FET, one end of said eighth resistor is connected to a connection point between said third FET and said fourth FET, one end of said ninth resistor is connected to said second high frequency signal input and output terminal, the other ends of said fifth through ninth resistors are connected in common to said second control terminal, a high level voltage or a low level voltage is selectively applied to said first control terminal, and a predetermined voltage is applied to said second control terminal, and wherein a third control terminal is connected to a voltage input terminal of a step-up circuit; a voltage output terminal of said stepup circuit is connected to said second control terminal; a voltage output terminal of said step-up circuit is connected to a supply voltage terminal of a logic circuit; a fourth control terminal is connected to a signal input terminal of said logic circuit; and a signal output terminal of said logic circuit is connected to said first control terminal.

2. A high frequency switch circuit, comprising:
a first FET, a second FET, a third FET, a fourth FET, a first high frequency signal input and output terminal, a second high frequency signal input and output terminal, first through ninth resistors, a first control terminal, and a second control terminal, wherein said first FET has a drain terminal connected to a source terminal of the second FET, a drain terminal of said second FET is connected to a source terminal of said third FET, a drain terminal of said third FET is connected to a source terminal of said fourth FET, a source terminal of said first FET is connected to said first high frequency signal input and output terminal, a drain terminal of said fourth FET is connected to said second high frequency signal input and output terminal, one end of said first resistor is connected to a gate terminal of said first FET, one end of said second resistor is connected to a gate terminal of said second FET, one end of said third resistor is connected to a gate terminal of said third FET, one end of said fourth resistor is connected to a gate terminal of said fourth FET, the other ends of said first through fourth resistors are connected in common to said first control terminal, one end of said fifth resistor is connected to said first high frequency signal input and output terminal, one end of said sixth resistor is connected to a connection point between said first FET and said second FET, one end of said seventh resistor is connected to a connection point between said second FET and said third FET, one end of said eighth resistor is connected to a connection point between said third FET and said fourth FET, one end of said ninth resistor is connected to said second high frequency signal input and output terminal, the other ends of said fifth through ninth resistors are connected in common to said second control terminal, a high level voltage or a low level voltage is selectively applied to said first control terminal, and a predetermined voltage is applied to said second control terminal, and wherein a third control terminal is connected to a voltage input terminal of a step-up circuit; a voltage output terminal of said stepup circuit is connected-to the anode of a diode; the cathode of said diode is connected to said second control terminal; a voltage output terminal of said step-up circuit is connected to a supply voltage terminal of a logic circuit; a fourth control terminal is connected to a signal input terminal of said logic circuit; and a signal output terminal of said logic circuit is connected to said first control terminal.

3. A high frequency switch circuit, comprising:
a first FET, a second FET, a third FET, a fourth FET, a first high frequency signal input and output terminal, a second high frequency signal input and output terminal, first through ninth resistors, a first control terminal, and a second control terminal, wherein said first FET has a drain terminal connected to a source terminal of the second FET, a drain terminal of said second FET is connected to a source terminal of said third FET, a drain terminal of said third FET is connected to a source terminal of said fourth FET, a source terminal of said first FET is connected to said first high frequency signal input and output terminal, a drain terminal of said fourth FET is connected to said second high frequency signal input and output terminal, one end of said first resistor is connected to a gate terminal of said first FET, one end of said second resistor is connected to a gate terminal of said second FET, one end of said third resistor is connected to a gate terminal of said third FET, one end of said fourth resistor is connected to a gate terminal of said fourth FET, the other ends of said first through fourth resistors are connected in common to said first control terminal, one end of said fifth resistor is connected to said first high frequency signal input and output terminal, one end of said sixth resistor is connected to a connection point between said first FET and said second FET, one end of said seventh resistor is connected to a connection point between said second FET and said third FET, one end of said eighth resistor is connected to a connection point between said third FET and said fourth FET, one end of said ninth resistor is connected to said second high frequency signal input and output terminal, the other ends of said fifth through ninth resistors are connected in common to said second control terminal, a high level voltage or a low level voltage is selectively applied to said first control terminal, and a predetermined voltage is applied to said second control terminal, and wherein a third control terminal is connected to a voltage input terminal of a step-up circuit; a voltage output terminal of said stepup circuit is connected to one voltage input terminal of a voltage selection circuit; said third control terminal is connected to the other voltage input terminal of said voltage selection circuit; a voltage output terminal of said voltage selection circuit is connected to said second control terminal; a voltage output terminal of said step-up circuit is connected to a supply voltage terminal of a logic circuit; a fourth control terminal is connected to a signal input terminal of said logic circuit; a signal output terminal of said logic circuit is connected to said first control terminal; and said fourth control terminal is connected to a switching control terminal of said voltage selection circuit; whereby when a control signal for turning OFF said first through fourth FETs is provided to said fourth control terminal, said voltage selection circuit selects the voltage of said third control terminal, while when a control signal for turning ON said first through fourth FETs is provided to said fourth control terminal, said voltage selection circuit selects the output voltage of said step-up circuit.

4. A high frequency switch circuit, comprising:
a first FET, a second FET, a third FET, a fourth FET, a first high frequency signal input and output terminal, a second high frequency signal input and output terminal, first through ninth resistors, a first control terminal, and a second control terminal, wherein said first FET has a drain terminal connected to a source terminal of the second FET, a drain terminal of said second FET is connected to a source terminal of said third FET, a drain terminal of said third FET is connected to a source terminal of said fourth FET, a source terminal of said first FET is connected to said first high frequency signal input and output terminal, a drain terminal of said fourth FET is connected to said second high frequency signal input and output terminal, one end of said first resistor is connected to a gate terminal of said first FET, one end of said second resistor is connected to a gate terminal of said second FET, one end of said third resistor is connected to a gate terminal of said third FET, one end of said fourth resistor is connected to a gate terminal of said fourth FET, the other ends of said first through fourth resistors are connected in common to said first control terminal, one end of said fifth resistor is connected to said first high frequency signal input and output terminal, one end of said sixth resistor is connected to a connection point between said first FET and said second FET, one end of said seventh resistor is connected to a connection point between said second FET and said third FET, one end of said eighth resistor is connected to a connection point between said third FET and said fourth FET, one end of said ninth resistor is connected to said second high frequency signal input and output terminal, the other ends of said fifth through ninth resistors are connected in common to said second control terminal, a high level voltage or a low level voltage is selectively applied to said first control terminal, and a predetermined voltage is applied to said second control terminal, and wherein a third control terminal is connected to a voltage input terminal of a step-up circuit; a voltage output terminal of said stepup circuit is connected to one voltage input terminal of a voltage selection circuit; said third control terminal is connected to the other voltage input terminal of said voltage selection circuit; a voltage output terminal of said voltage selection circuit is connected to the anode of a diode; the cathode of said diode is connected to said second control terminal; a voltage output terminal of said step-up circuit is connected to a supply voltage terminal of a logic circuit; a fourth control terminal is connected to a signal input terminal of said logic circuit; a signal output terminal of said logic circuit is connected to said first control terminal; and said fourth control terminal is connected to a switching control terminal of said voltage selection circuit; whereby when a control signal for turning OFF said first through fourth FETs is provided to said fourth control terminal, said voltage selection circuit selects the voltage of said third control terminal, while when a control signal for turning ON said first through fourth FETs is provided to said fourth control terminal, said voltage selection circuit selects the output voltage of said step-up circuit.

5. A high frequency switch circuit, comprising:

a first FET, a second FET, a third FET, a fourth FET, a first high frequency signal input and output terminal, a second high frequency signal input and output terminal, first through ninth resistors, a first control terminal, and a second control terminal, wherein said first FET has a drain terminal connected to a source terminal of the second FET, a drain terminal of said second FET is connected to a source terminal of said third FET, a drain terminal of said third FET is connected to a source terminal of said fourth FET, a source terminal of said first FET is connected to said first high frequency signal input and output terminal, a drain terminal of said fourth FET is connected to said second high frequency signal input and output terminal, one end of said first resistor is connected to a gate terminal of said first FET, one end of said second resistor is connected to a gate terminal of said second FET, one end of said third resistor is connected to a gate terminal of said third FET, one end of said fourth resistor is connected to a gate terminal of said fourth FET, the other ends of said first through fourth resistors are connected in common to said first control terminal, one end of said fifth resistor is connected to said first high frequency signal input and output terminal, one end of said sixth resistor is connected to a connection point between said first FET and said second FET, one end of said seventh resistor is connected to a connection point between said second FET and said third FET, one end of said eighth resistor is connected to a connection point between said third FET and said fourth FET, one end of said ninth resistor is connected to said second high frequency signal input and output terminal, the other ends of said fifth through ninth resistors are connected in common to said second control terminal, a high level voltage or a low level voltage is selectively applied to said first control terminal, and a predetermined voltage is applied to said second control terminal, and wherein the resistance values of said fifth through ninth resistors are 1 kΩ or higher.

* * * * *